(12) United States Patent
Kim et al.

(10) Patent No.: US 8,084,936 B2
(45) Date of Patent: Dec. 27, 2011

(54) ORGANIC LIGHT EMITTING DEVICE HAVING AN INORGANIC ISOLATION PATTERN AND METHOD OF MANUFACTURING THE SAME

(75) Inventors: Jeong Hyun Kim, Gyeonggi-do (KR); Jae Yoon Lee, Seoul (KR); Heung Lyul Cho, Gyeonggi-do (KR); Joon Suk Lee, Seoul (KR); Hee Dong Choi, Chungcheongnam-do (KR)

(73) Assignee: LG Display Co., Ltd., Seoul (KR)

( * ) Notice: Subject to any disclaimer, the term of this patent is extended or adjusted under 35 U.S.C. 154(b) by 541 days.

(21) Appl. No.: 11/770,529

(22) Filed: Jun. 28, 2007

(65) Prior Publication Data
US 2008/0001535 A1 Jan. 3, 2008

(30) Foreign Application Priority Data
Jun. 30, 2006 (KR) .................. 10-2006-0060470

(51) Int. Cl.
*H01J 1/62* (2006.01)
*G09G 3/10* (2006.01)

(52) U.S. Cl. .......... 313/504; 313/506; 313/507; 445/24; 445/25

(58) Field of Classification Search .......... 313/501–512
See application file for complete search history.

(56) References Cited

U.S. PATENT DOCUMENTS

| | | | |
|---|---|---|---|
| 6,339,288 B1 * | 1/2002 | Qian et al. | 313/498 |
| 6,626,721 B1 | 9/2003 | Van Slyke | |
| 2005/0140303 A1 * | 6/2005 | Lee et al. | 315/169.3 |
| 2005/0142974 A1 * | 6/2005 | Lee | 445/24 |
| 2006/0119259 A1 * | 6/2006 | Bae et al. | 313/506 |
| 2006/0202205 A1 | 9/2006 | Lee et al. | |

FOREIGN PATENT DOCUMENTS

| | | |
|---|---|---|
| CN | 1347266 A | 5/2002 |
| CN | 1638554 A | 7/2005 |
| CN | 1783488 A | 6/2006 |

* cited by examiner

*Primary Examiner* — Anne Hines
*Assistant Examiner* — Tracie Green
(74) *Attorney, Agent, or Firm* — Birch, Stewart, Kolasch & Birch, LLP

(57) ABSTRACT

An organic light emitting device including a first electrode disposed on a substrate, a separator disposed on the first electrode in a lattice shape and having a groove-shaped isolation portion that gradually expands from an entrance toward an inside of the isolation portion, organic light emitting patterns disposed on the first electrode surrounded by the separator, the organic light emitting patterns being separated by the isolation portion, and second electrodes disposed on the organic light emitting patterns and separated by the isolation portion.

16 Claims, 10 Drawing Sheets

ORGANIC LIGHT EMITTING DEVICE HAVING AN INORGANIC ISOLATION PATTERN AND METHOD OF MANUFACTURING THE SAME

This invention claims priority to Korean Application No. 10-2006-0060470, filed in Korea on Jun. 30, 2006, the entire contents of which is hereby incorporated in its entirety.

BACKGROUND OF THE INVENTION

1. Field of the Invention

The present invention relates to an organic light emitting device and a method of manufacturing the same.

2. Description of the Related Art

In recent years, research and development has been ongoing concerning information processing devices that can process a large amount of data in a short time and display devices that can display the processed data. In more detail, the display devices are classified into analog display devices and digital display devices. The analog display devices include cathode ray tubes (CRTs), etc., and the digital display devices include liquid crystal display devices (LCDs), organic light emitting devices (OLEDs), plasma display panels (PDPs), etc.

Further, digital display devices are widely used, because they are slim and lightweight compared to analog display devices. In addition, much attention has been paid to OLEDs.

In addition, when seen in a plan view, a related art OLED includes a separator arranged in a lattice shape on a common electrode formed on a substrate. When seen in a sectional view, the separator has a reversely tapered shape. Further, the separator is formed by patterning an organic layer, which includes a photosensitive organic substance and a solvent dissolving the photosensitive organic substance.

Also, a vacuum deposition process is performed to form an organic light emitting layer on the common electrode where the separator is formed. Then, a pixel electrode is formed on the organic light emitting layer. The reversely tapered separator electrically separates the organic light emitting layers and the pixel electrodes.

The related art OLED, however, has a problem in that the organic light emitting layer is easily degraded by various gases, oxygen, hydrogen, and moisture. To solve this problem, the OLED includes a blocking layer for preventing the organic light emitting layer from contacting harmful substances, e.g., various gases, oxygen, hydrogen, moisture, etc. That is, the blocking layer seals the organic light emitting layer. The blocking layer also seals the separator formed of the organic material, as well as the organic light emitting layer.

However, when the blocking layer seals the separator as well as the organic light emitting layer, the characteristics of the organic light emitting layer sealed by the blocking layer are severely degraded by the solvent volatilized from the separator. Consequently, the organic light emitting layer is significantly damaged, and thus the lifetime of the OLED is significantly reduced.

SUMMARY OF THE INVENTION

Accordingly, the present invention is directed to an OLED and a method of manufacturing the same that substantially obviate one or more problems due to limitations and disadvantages of the related art.

An object of the present invention is to provide an OLED that can electrically separate organic light emitting layers and pixel electrodes without any additional patterning process, and prevent separators from generating gas causing the degradation of the organic light emitting layers, thereby providing an improved performance and extended lifetime of the OLED.

To achieve these objects and other advantages and in accordance with the purpose of the invention, as embodied and broadly described herein, the present invention provides in one aspect an organic light emitting device including a first electrode disposed on a substrate, a separator disposed on the first electrode in a lattice shape and having a groove-shaped isolation portion, an organic light emitting pattern disposed on the first electrode opened by the separator, and a second electrode disposed on the organic light emitting pattern.

In another aspect, the present invention provides a method of manufacturing an organic light emitting device. The method includes forming a first electrode on a substrate, forming a separator on the first electrode in a lattice shape to expose a pixel region, the separator having a groove-shaped isolation portion, forming organic light emitting patterns on the first electrode surrounded by the separator, the organic light emitting patterns being separated from one another by the isolation portion, and forming second electrodes on the separated organic light emitting patterns, the second electrodes being separated by the isolation portion.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
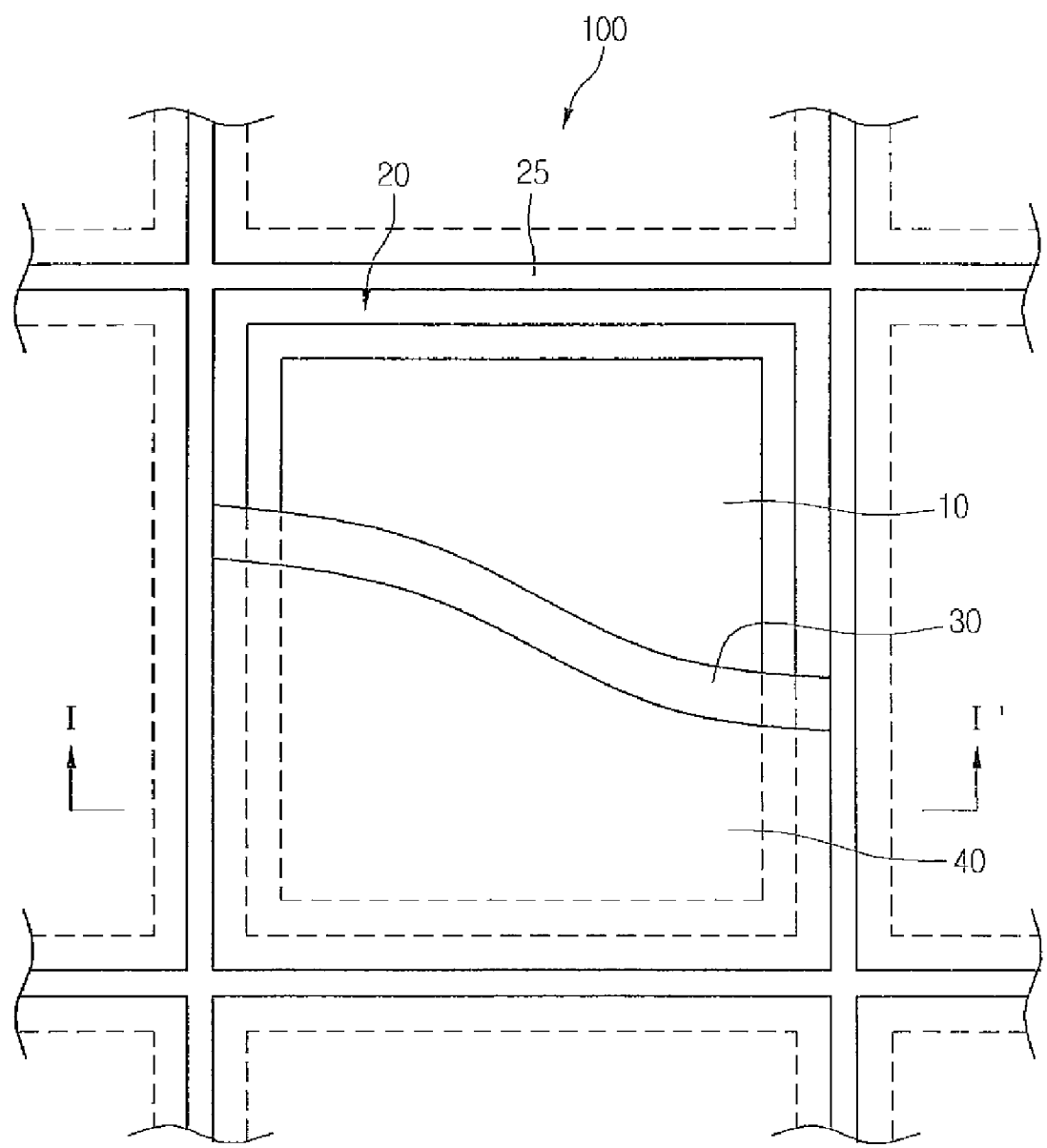
FIG. 1 is a partial plan view of an OLED according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts. In the drawings, the dimensions of a first electrode, a separator, an organic light emitting pattern, a second electrode, and other structures are exaggerated for illustration purposes. It also to be understood that when the first electrode, the separator, the organic light emitting pattern, the second electrode, and other structures are referred to as being "on" or "under" a layer or a substrate, they can be directly on the layer or the substrate, or another intervening layers may be further formed. In addition, it is also to be understood that when the terms like "first", "second", and "third" are used to describe the electrodes, the separators, and other structures, the elements are not limited by these terms. These terms are used only to distinguish the elements from one another. Therefore, the terms "first" and "second" can be selectively or exchangeably used for the elements.

Organic Light Emitting Device

Figure 2:
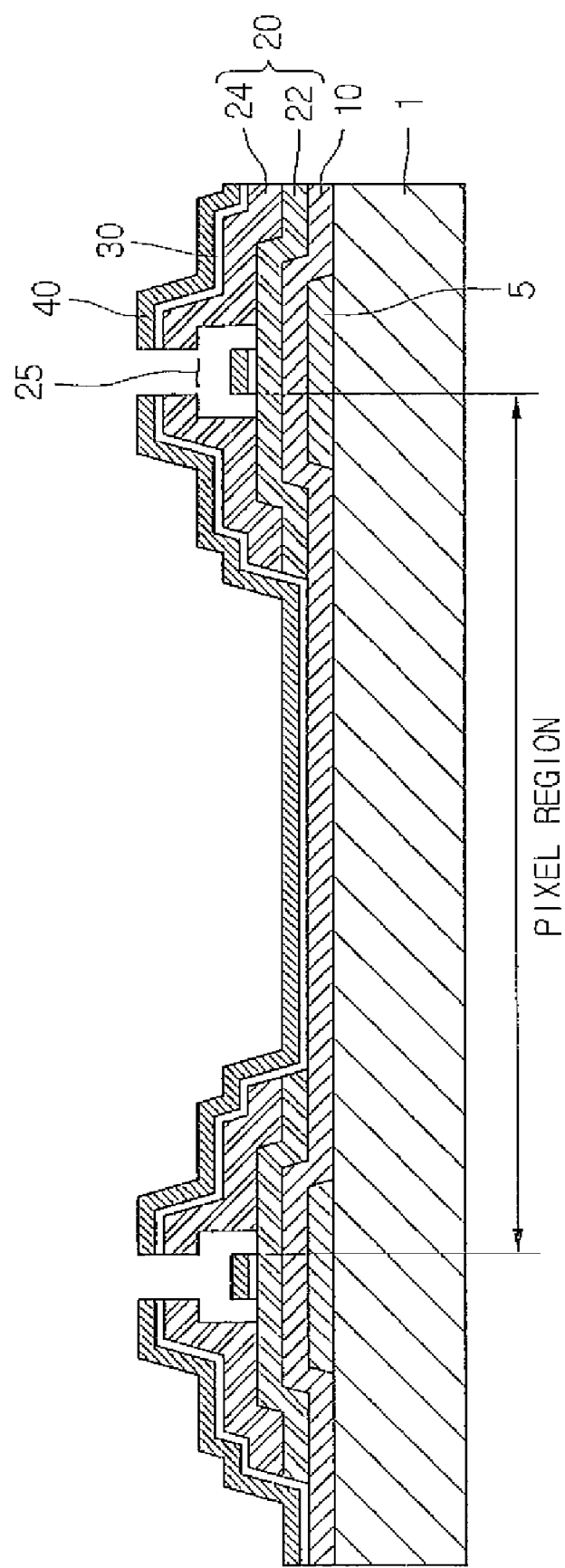
FIG. 2 is a cross-sectional view taken along line I-I' of FIG. 1.

Now turn to FIG. 1, which is a partial plan view of an organic light emitting device (OLED) according to an embodiment of the present invention, and FIG. 2, which is a cross-sectional view taken along line I-I' in FIG. 1.

Referring to FIGS. 1 and 2, the OLED 100 includes a substrate 1, a first electrode 10, inorganic separators 20, organic light emitting patterns 30, and second electrodes 40. Further, the substrate 1 includes a plate-shaped transparent substrate, which may be a glass substrate or a transparent resin substrate.

In addition, as shown in FIG. 2, the first electrode 10 is disposed on the substrate 1. The first electrode 10 may be transparent and conductive. Further, examples of a material that may be used as the first electrode 10 include indium tin oxide (ITO), indium zinc oxide (IZO), amorphous indium tin oxide (a-ITO), etc.

Also, the first electrode 10 is disposed over an entire area of the substrate 1. Meanwhile, bus lines 5 are interposed between the substrate 1 and the first electrode 10 to provide a driving signal to the first electrode 10. Further, auxiliary electrodes having an electrical resistance lower than that of the first electrode 10 may be interposed between the substrate 1 and the first electrode 10 so as to reduce an electrical resistance of the first electrode 10.

In addition, the separators 20 are disposed on the first electrode 10, and electrically separate the organic light emitting patterns 30 and the second electrodes 40 without any additional patterning process (see in particular FIG. 1). The organic light emitting patterns 30 will be described in more detail later. Further, the organic light emitting patterns 30 and the second electrodes 40 are self-aligned on the substrate 10 by the separators 20.

In addition, the separators 20 are disposed on the first electrode 10 in a lattice shape. As shown in FIG. 1, the lattice-shaped separators 20, in a plan view, are formed in a closed-loop shape. Also, an isolation portion 25 is disposed on the separators 20, and has a groove shape defining a space gradually expanding downward from an upper portion to a lower portion of the separator 20.

Further, as shown in FIG. 2, the separator 20 includes a first inorganic pattern 22 and a second inorganic pattern 24. That is, the first inorganic pattern 22 contacts the first electrode 10 and prevents the organic light emitting pattern 30 described later from being deposited on the first electrode 10. The second inorganic pattern 24 is disposed on the first inorganic pattern 22 and has a space gradually expanding downward from the entrance of the second inorganic pattern 24.

In addition, to form the isolation portion 25, an edge portion of the second inorganic pattern 24 contacts the first inorganic pattern 22, and a center portion of the second inorganic pattern 24 is spaced apart from the first inorganic pattern 22. The entrance of the isolation portion 25, in a plane view, has a lattice shape due to the second inorganic pattern 24.

Examples of a material that may be used as the first inorganic pattern 22 and the second inorganic pattern 24 include silicon oxide (SiOx) or silicon nitride (SiNx), etc. Further, the organic light emitting pattern 30 includes an organic light emitting layer (not shown) contacting to the exposed first electrode 10. The organic light emitting layer 30 emits light when holes and electrons provided from the outside are combined therein. In addition, the organic light emitting layer 30 includes a hole injection layer (HIL), a hole transport layer (HTL), an electron injection layer (EIL), and an electron transport layer (ETL). The hole injection layer and the hole transport layer provide holes, and the electron injection layer and the electron transport layer provide electrons.

Also, the organic light emitting patterns 30 are disposed on the first electrode 10 arranged in a pixel region defined by being surrounded by the separators 20, the top surface of the second inorganic pattern 24, and the first inorganic pattern 22 provided inside the isolation portion 25. In addition, because some of the organic light emitting patterns 30 are disposed on the second inorganic pattern 24 through the isolation portion 25, the organic light emitting patterns 30 are electrically separated from one another without any patterning process.

Further, the second electrodes 40 are disposed on the organic light emitting pattern 30 provided on the first electrode 10, and the organic light emitting pattern provided inside the isolation portion 25. At this point, because some of the second electrodes 40 are disposed inside the isolation portion 25, the second electrodes 40 are electrically separated from one another without any additional patterning process. In addition, the second electrodes 40 are formed of a metal having a low work function. For example, materials that may be used as the second electrodes 40 include aluminum, aluminum alloy, etc.

As described above, the separators 20 are formed on the first electrode 10, and include an inorganic material having a closed-loop shape when seen in a plan view. In addition, the separators 20 have the groove-shaped isolation portion 25 so as to form the organic light emitting pattern 30 and the second electrode 40 without any additional patterning process. Accordingly, the generation of gas like the solvent from the separators 20 can be suppressed, thereby preventing the degradation of the organic light emitting pattern 30.

Method of Manufacturing the OLED

Figure 3:
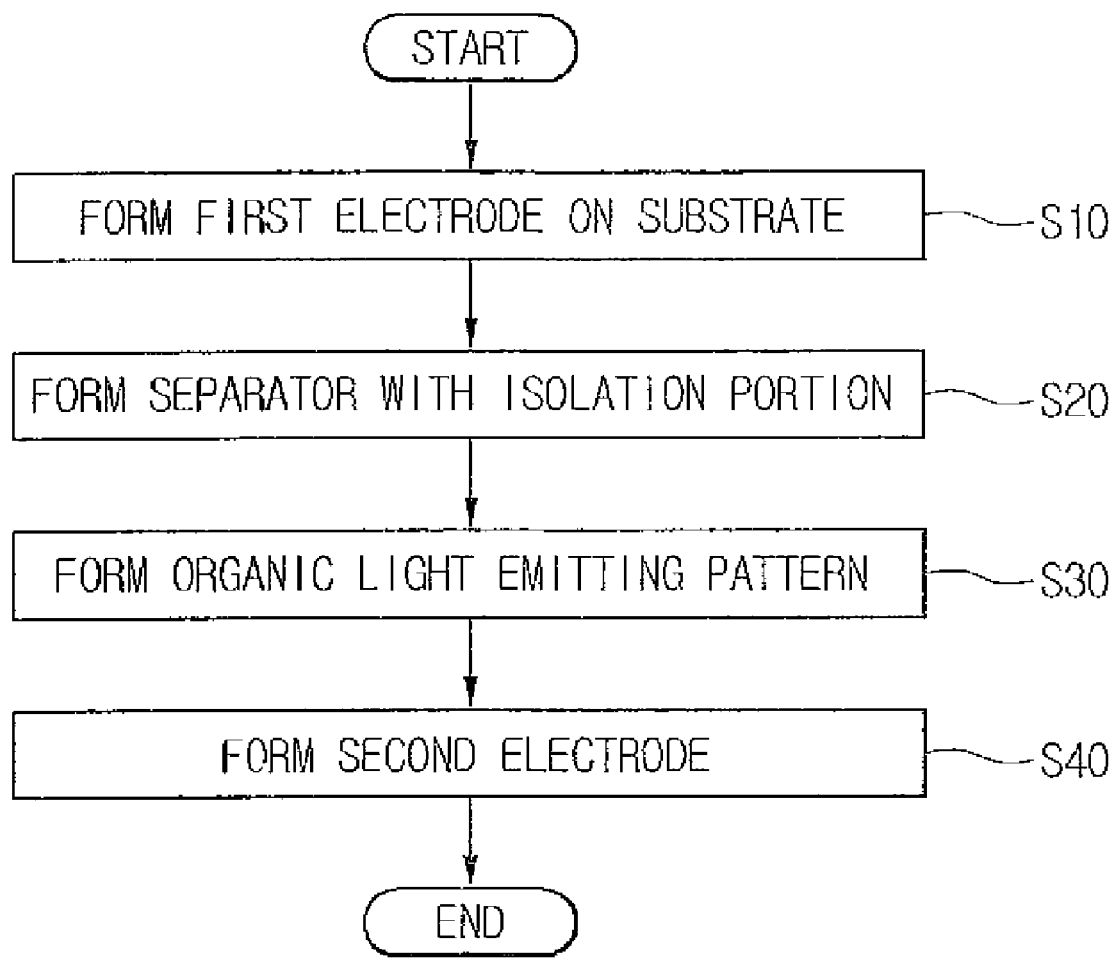
FIG. 3 is a flowchart illustrating a method of fabricating an OLED according to an embodiment of the present invention.
Figure 4:
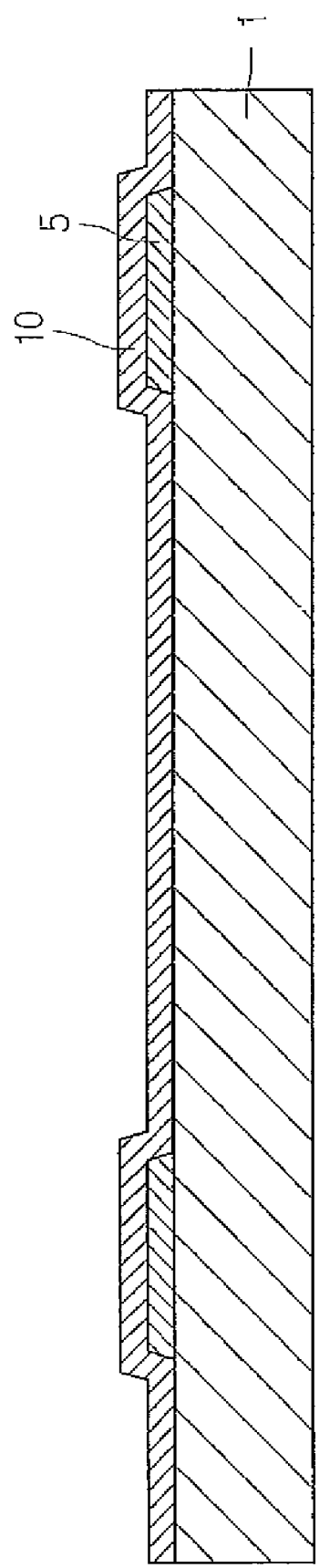
FIG. 4 is a cross-sectional view of a first electrode formed on a substrate according to an embodiment of the present invention.

FIG. 3 is a flowchart illustrating a method of fabricating an OLED according to an embodiment of the present invention, and FIG. 4 is a cross-sectional view of a first electrode formed on a substrate according to an embodiment of the present invention.

Referring to FIGS. 3 and 4, the conductive bus lines 5 are formed on the substrate 1, e.g., a transparent glass substrate. Further, to form the bus lines 5, a metal layer (not shown) is formed on the substrate 1. The metal layer may be formed using a chemical vapor deposition (CVD) process or a sputtering process. Examples of a material that may be used as the metal layer include aluminum, aluminum alloy, etc.

After forming the metal layer on the substrate, a photoresist film (not shown) is formed over an entire area of the metal layer. The photoresist film may be formed by a spin coating process or a slit coating process, etc. Then, the photoresist film is patterned by a photo process having an exposing process and a developing process to form photoresist patterns (not shown) on the metal layer.

The metal layer is patterned using the photoresist film as an etching mask to form the bus lines 5 on the substrate 1. Meanwhile, the bus lines 5 may also be formed by a vacuum deposition process using a shadow mask. The bus lines 5 provide a driving signal to the first electrode 10, which will be described later.

Then, as shown in FIG. 3, the first electrode 10 is formed on the substrate 1 (S10). The first electrode 10 is transparent and conductive, and may be formed on the substrate 1 by a sputtering process, a CVD process, or a vacuum deposition process, etc. Examples of a material that may be used as the first electrode 10 include ITO, IZO, or a-ITO, etc. In addition, the first electrode 10 formed on the substrate 1 may include a low-resistance metal.

Next, FIGS. 5 to 9 are cross-sectional views illustrating a process of forming separators on the first electrode shown in FIG. 4. FIG. 3 will also be referred to in this description.

Figure 5:
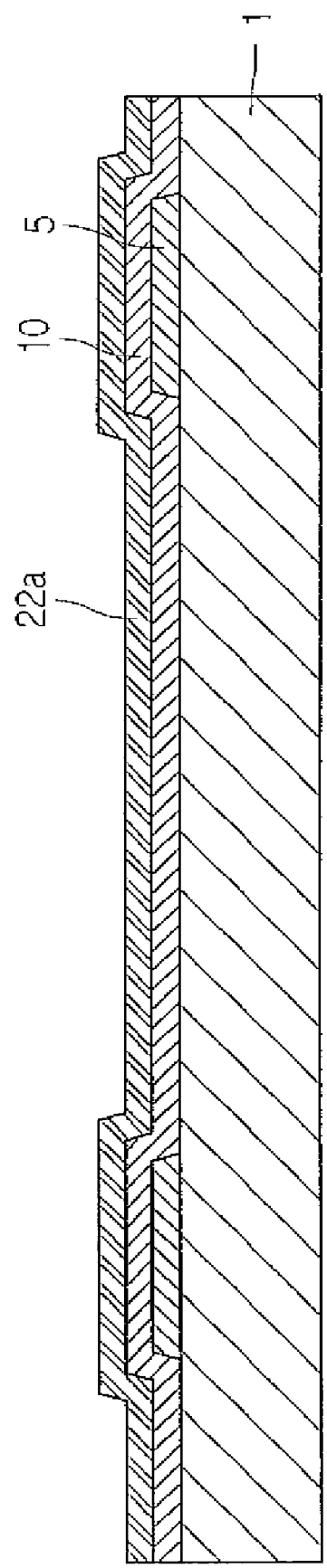
FIGS. 5 to 9 are cross-sectional views illustrating a process of forming a separator on the first electrode shown in FIG. 4.

Referring to FIGS. 3 and 5, a first inorganic layer 22a is formed on the first electrode 10 so as to form separators having an isolation portion (S20). In this embodiment, the first inorganic layer 22a is formed on the first electrode 10 by a CVD process or a vacuum deposition process, etc. Examples of a material that may be used as the first inorganic layer 22a include silicon oxide, silicon nitride, etc.

Figure 6:
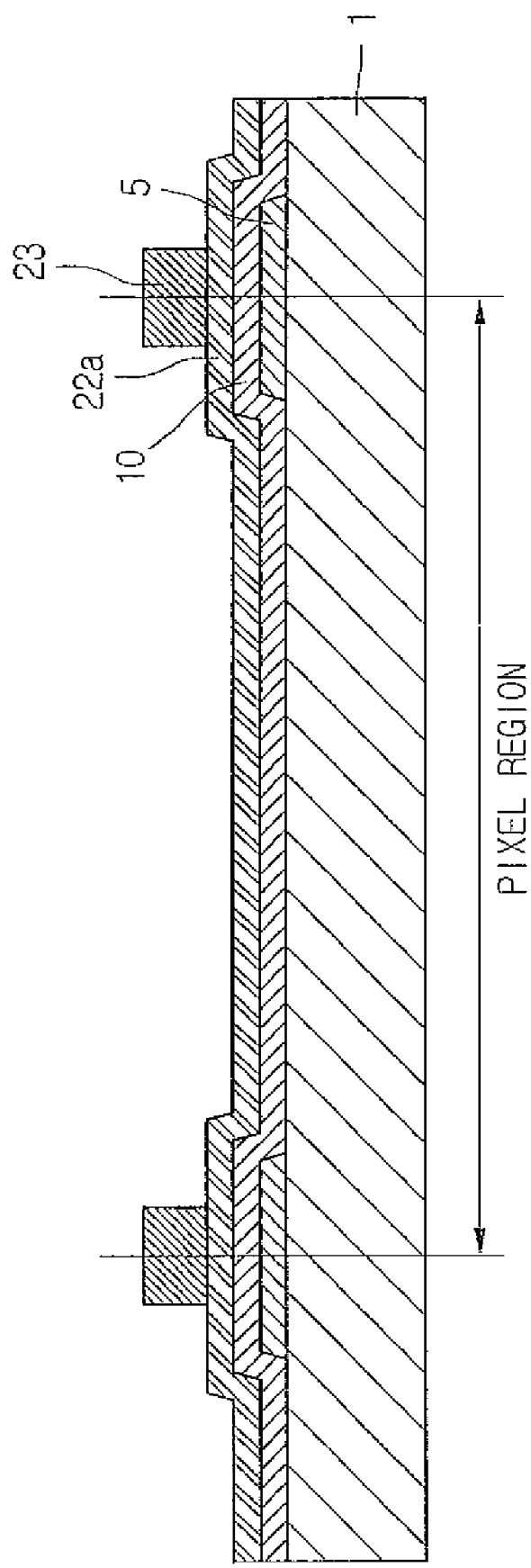

Next, as shown in FIG. 6, sacrificial patterns 23 are formed on the first inorganic layer 22a. Specifically, an organic layer (not shown) is formed on the first inorganic layer 22a by a spin coating process or a slit coating process, etc. The organic layer is patterned by a photo process having a light exposing process and a developing process to form the sacrificial layers 23 on the first inorganic layer 22a. In this embodiment, examples of a material that may be used as the sacrificial patterns 23 include photoresist substance, polyimide, acryl-based resin, etc.

Figure 7:
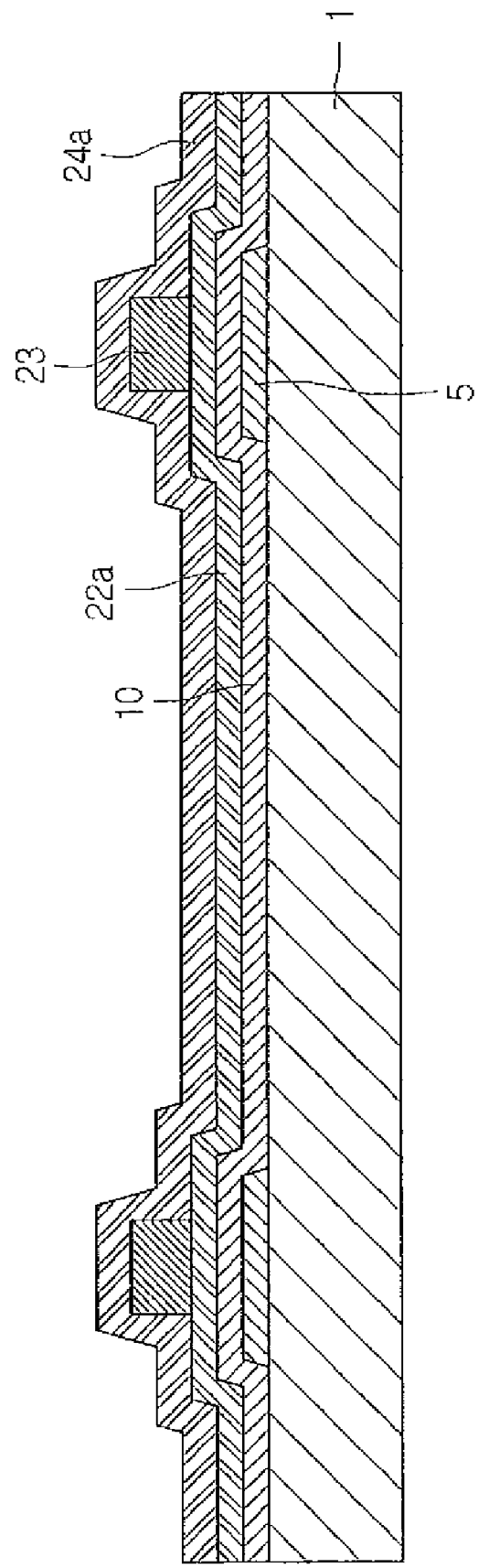

In addition, the sacrificial patterns 23, in a plane view, are disposed around a pixel region having a square shape or rectangular shape. The sacrificial patterns 23, for example, have a band shape and are formed around the pixel region in a closed-loop shape. Next, as shown in FIG. 7, a second inorganic layer 24a is formed on the first inorganic layer 22a. The second inorganic layer 24a covers the first inorganic layer 22a and the sacrificial pattern 23, and may be formed on the first inorganic layer 22a by a CVD process or a vacuum deposition process, etc. The second inorganic layer 24a may be formed of oxide or nitride.

Figure 8:
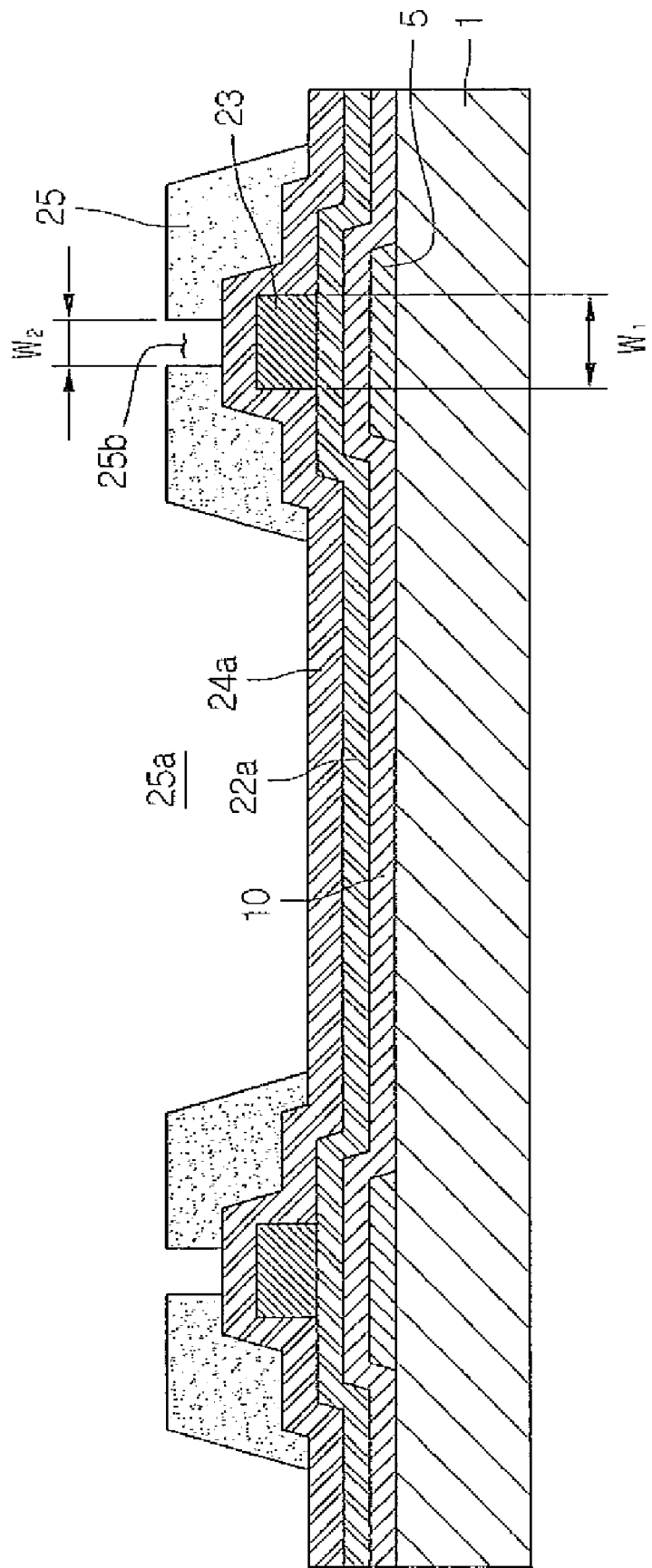

Then, with reference to FIG. 8, a photoresist film (not shown) containing photosensitive substance is formed over an entire area of the second inorganic layer 24a. The photoresist film is patterned using a photo process having a light exposing process and a developing process to form photoresist patterns 25 on the second inorganic layer 24a. In this embodiment, the photoresist patterns 25 have an opening 25a exposing a portion of the second inorganic layer 24a corresponding to the pixel region, and an opening 25b exposing a portion of the second inorganic layer 24a corresponding to the sacrificial pattern 23 in a slit shape.

The opening 25a exposing a portion of the second inorganic layer 24a in a slit shape has a closed-loop shape. When a width of sacrificial pattern 23 is $W_1$, a width $W_2$ of the opening 25b of the photoresist pattern 25 exposing the second inorganic layer 24a corresponding to the sacrificial pattern 23 is less than the width $W_1$ of the sacrificial pattern 23.

Figure 9:
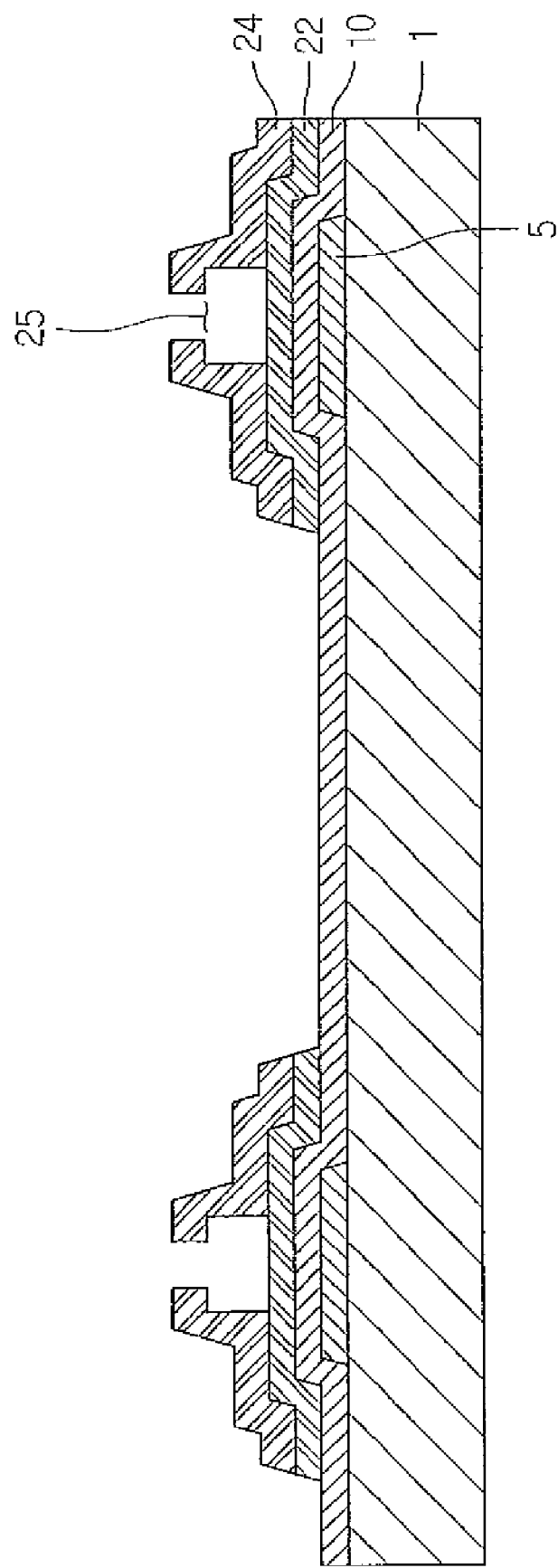

Next, as shown in FIG. 9, the second inorganic layer 24a and the first inorganic layer 22a are etched using the photoresist patterns 25 as an etching mask. That is, the second inorganic layer 24a and the first inorganic layer 22a corresponding to the opening 25a and the second inorganic layer 24a corresponding to the opening 25b may be wet etched by an etchant reacting with an inorganic material. Alternatively, the second inorganic layer 24a and the first inorganic layer 22a corresponding to the opening 25a and the first inorganic layer 24a corresponding to the opening 25b may be dry etched using a plasma.

As the second inorganic layer 24a and the first inorganic layer 22a are etched, the first inorganic patterns 22 exposing the pixel region are formed on a portion of the first electrode 10 corresponding to the opening 25a, and the second inorganic patterns 24 exposing the sacrificial pattern 23 are formed. Further, the first inorganic patterns 22 expose a portion of the first electrode 10 corresponding to the pixel region, and the second inorganic patterns 22 expose a portion of the top surface of the sacrificial pattern 23.

After exposing a portion of the sacrificial pattern 23 by the second inorganic pattern 24, the exposed sacrificial pattern 23 is removed from the first inorganic pattern 22 by an etchant or plasma. Specifically, the sacrificial pattern 23 is removed from the first inorganic pattern 22 by an etchant having a high etching selectivity with respect to the first and second inorganic patterns 22 and 24. Alternatively, the sacrificial pattern 23 may be removed from the first inorganic pattern 22 using oxygen plasma.

As the sacrificial pattern 23 is removed, an empty space having a closed-loop shape is formed between the first inorganic pattern 22 and the second inorganic pattern 24. Due to the space, the organic light emitting patterns and the second electrodes will be electrically separated without any patterning process, which will be described later. Hereinafter, the empty space will be referred to as the isolation portion 25.

Figure 10:
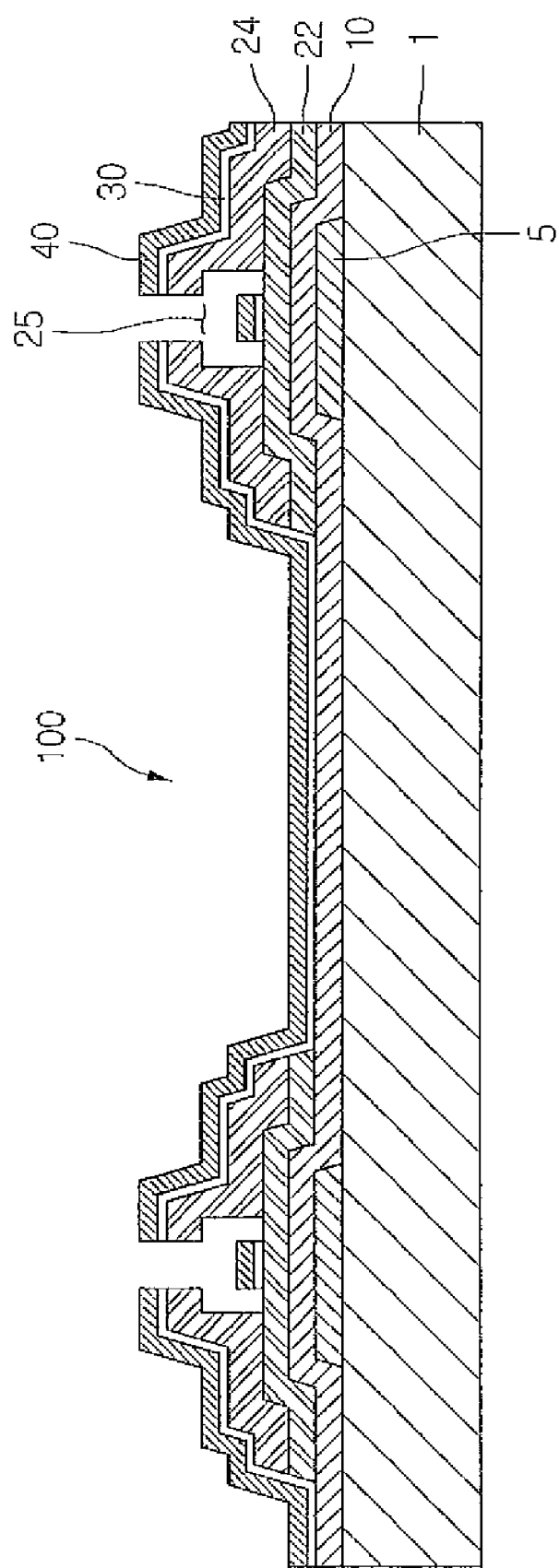
FIG. 10 is a cross-sectional view of an organic light emitting pattern and a second electrode formed on the substrate shown in FIG. 9.

Turn now to FIG. 10, which is a cross-sectional view of organic light emitting patterns and second electrodes formed on the substrate shown in FIG. 9. FIG. 3 will also be referred to in this description.

Referring to FIGS. 3 and 10, the organic light emitting patterns 30 are formed on the substrate 1 where the first and second inorganic patterns 22 and 24 are formed (S30). In addition, the organic light emitting patterns 30 may be formed using a vacuum deposition process, and may be formed of a hole injection layer (HIL) with a hole injection material, a hole transport layer (HTL) with a hole transport material, an organic light emitting layer with an organic light emitting material, an electron injection layer (EIL) with an electron injection material, and an electron transport layer (ETL) with an electron transport material.

Further, the hole injection material, the hole transport material, the organic light emitting material, the electron injection material, and the electron transport material are deposited on the separators 20 having the first and second inorganic separators 22 and 24 and the exposed first electrode 10. Consequently, the organic light emitting patterns 30 are electrically separated by the isolation portions 25 of the separators 20 without any additional patterning process.

Next, in step S40 of FIG. 3, a metal material having a low work function, e.g., aluminum or aluminum alloy, is deposited on the organic light emitting patterns 30 by a sputtering process or a vacuum deposition process, etc. Second electrodes 40 electrically separated are formed on the organic light emitting patterns 30 (S40). Through these procedures, the process of manufacturing the OLED 100 is completed.

As described above, the organic light emitting layers and the pixel electrodes can be electrically separated without any additional patterning process. Further, the separators are formed of inorganic material that does not generate gas such as the solvent, thereby increasing the performance and lifetime of the OLED.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic light emitting device, comprising:
a first electrode disposed on a substrate;
a separator disposed on the first electrode in a lattice shape and having a groove-shaped isolation portion wherein the separator comprises: a first inorganic pattern disposed on the first electrode to form a bottom of an inside of the isolation portion; and a second inorganic pattern disposed on the first inorganic pattern to form the isolation portion, without contacting the first electrode, and wherein edge sides of the first and second inorganic patterns are disposed on top of a bus line and are disposed in the isolation portion;
an organic light emitting pattern disposed on the first electrode opened by the separator; and
a second electrode disposed on the organic light emitting pattern.

2. The organic light emitting device according to claim 1, wherein the first and second inorganic patterns are formed of an inorganic material.

3. The organic light emitting device according to claim 2, wherein the inorganic material comprises nitride or oxide.

4. The organic light emitting device according to claim 1, wherein the first electrode includes a transparent conductive layer.

5. The organic light emitting device according to claim 1, wherein the second electrode includes a metal material.

6. The organic light emitting device according to claim 1, wherein the isolation portion has a closed-loop-shaped slit when seen in a plan view.

7. The organic light emitting device according to claim 1, wherein the isolation portion gradually expands from an upper portion to a lower portion of the separator.

8. The organic light emitting device according to claim 1, further comprising:
a bus line interposed between the first electrode and the substrate to apply a driving signal.

9. A method of manufacturing an organic light emitting device, the method comprising:
forming a first electrode on a substrate;
forming a separator on the first electrode in a lattice shape to expose a pixel region, the separator having a groove-shaped isolation portion;
forming organic light emitting patterns on the first electrode surrounded by the separator, the organic light emitting patterns being separated from one another by the isolation portion; and
forming second electrodes on the separated organic light emitting patterns, the second electrodes being separated by the isolation portion,
wherein the separator comprises:
a first inorganic pattern disposed on the first electrode to form a bottom of an inside of the isolation portion; and
a second inorganic pattern disposed on the first inorganic pattern to form the isolation portion, without contacting the first electrode,
wherein the isolation portion is disposed on the second inorganic pattern,
wherein the organic light emitting patterns are disposed on the second inorganic pattern provided inside the isolation portion,
wherein the forming of the separator comprises:
forming a first layer on the first electrode;
forming a sacrificial pattern using an organic material around the pixel region on the first layer in a closed-loop shape;
forming a second layer to cover the sacrificial pattern;
forming a photoresist pattern exposing a portion of the second layer corresponding to the pixel region and a portion of the second layer corresponding to the sacrificial pattern;
removing a portion of the first and second layers corresponding to the pixel region to form the first and second inorganic pattern and exposing the sacrificial pattern using the photoresist pattern as an etching mask; and
removing the exposed sacrificial pattern to form the isolation portion,
wherein the sacrificial pattern is removed by an etchant having a high etching selectively with respect to the first and second inorganic pattern without damage to the first and second inorganic pattern, and
wherein edge sides of the first and second inorganic pattern are disposed on top of a bus line and are disposed in the isolation portion.

10. The method according to claim 9, wherein the first and second layers are formed of an inorganic material.

11. The method according to claim 10, wherein the inorganic material comprises one of an oxide and a nitride.

12. The method according to claim 9, wherein the forming of the sacrificial pattern comprises:
forming an organic layer on the first layer; and
patterning the organic layer using an exposing process.

13. The method according to claim 12, wherein the organic layer is formed of one of acryl and polyimide.

14. The method according to claim 9, wherein the second electrode is formed of one of aluminum and an aluminum alloy.

15. The method according to claim 9, further comprising, prior to the formation of the first electrode, forming the bus line on the substrate so as to apply a driving signal.

16. The method according to claim 15, wherein the bus line has a first resistance and the first electrode has a second resistance lower than the first resistance.

* * * * *